United States Patent
Oh et al.

(10) Patent No.: US 8,247,880 B2
(45) Date of Patent: Aug. 21, 2012

(54) MAGNETIC MEMORY DEVICE AND METHOD OF FABRICATING THE SAME

(75) Inventors: Se-Chung Oh, Suwon-si (KR); Jang-Eun Lee, Suwon-si (KR); Kyung-Tae Nam, Suwon-si (KR); Woo-Jin Kim, Yongin-si (KR); Dae-Kyom Kim, Daejeon (KR); Jun-ho Jeong, Suwon-si (KR); Seung-Yeol Lee, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 514 days.

(21) Appl. No.: 12/372,083

(22) Filed: Feb. 17, 2009

(65) Prior Publication Data

US 2009/0206427 A1    Aug. 20, 2009

(30) Foreign Application Priority Data

Feb. 15, 2008   (KR) .......................... 10-2008-0013985

(51) Int. Cl.
*H01L 29/82* (2006.01)
*G11C 11/00* (2006.01)

(52) U.S. Cl. ............... 257/421; 257/427; 257/E29.323; 365/158

(58) Field of Classification Search ................. 257/421, 257/422, 427, E27.006, E29.323, 295; 365/158, 365/171

See application file for complete search history.

(56) References Cited

U.S. PATENT DOCUMENTS

| | | | |
|---|---|---|---|
| 2004/0136231 A1* | 7/2004 | Huai et al. | 365/158 |
| 2005/0020076 A1 | 1/2005 | Lee et al. | |
| 2005/0063222 A1* | 3/2005 | Huai et al. | 365/171 |
| 2005/0146967 A1 | 7/2005 | Park et al. | |

FOREIGN PATENT DOCUMENTS

| | | |
|---|---|---|
| JP | 2005-045197 | 2/2005 |
| JP | 2005-129957 | 5/2005 |
| JP | 2006-86322 | 3/2006 |
| KR | 2005-10428 | 1/2005 |
| KR | 2005-39233 | 4/2005 |

* cited by examiner

*Primary Examiner* — VanThu Nguyen
*Assistant Examiner* — Hien Nguyen
(74) *Attorney, Agent, or Firm* — Stanzione & Kim, LLP

(57) ABSTRACT

A magnetic memory device and a method of fabricating the same. The magnetic memory device includes a free layer, a write element, and a read element. The write element changes the magnetization direction of the free layer, and the read element senses the magnetization direction of the free layer. Herein, the write element includes a current confinement layer having a width smaller than the minimum width of the free layer to locally increase the density of a current flowing through the write element.

14 Claims, 8 Drawing Sheets

MAGNETIC MEMORY DEVICE AND METHOD OF FABRICATING THE SAME

CROSS-REFERENCE TO RELATED APPLICATIONS

This U.S. non-provisional patent application claims priority under 35 U.S.C. §119 of Korean Patent Application No. 10-2008-0013985, filed on Feb. 15, 2008, the entire contents of which are hereby incorporated by reference.

BACKGROUND

1. Field of the Invention

The present general inventive concept disclosed herein relates to a semiconductor device and a method of fabricating the same, and more particularly, to a magnetic memory device and a method of fabricating the same.

2. Description of the Related Art

Typical semiconductor electronic devices use electrical characteristics depending on the charge quantities, whereas spintronic devices use the electrical characteristics depending on the spins of electrons. Examples of the spintronic devices are magnetic memory devices that use the spin of electrons to store data and read the stored data. The magnetic memory devices can be classified into a giant magneto-resistance (GMR) element using a GMR effect and a tunneling magneto-resistance (TMR) element using a TMR effect.

The GMR effect, which was first discovered in an Fe/Cr artificial lattice by M. N Baibich et al. in 1998, is generally a magneto-resistance effect that occurs when a ferromagnetic layer and a nonmagnetic layer form an artificial lattice. It is known that a relatively large magneto-resistance (MR) can be achieved even under the condition of a weak magnetic field when an anti-ferromagnetic layer/a ferromagnetic layer/a nonmagnetic layer/a ferromagnetic layer such as IrMn/NiFe/Cu/NiFe are sequentially stacked. However, since there is exchange coupling between thin layers in an artificial lattice structure, the GMR element using the artificial lattice structure is lower in MR than the TMR element.

The TMR effect is a magneto-resistance effect that occurs when a pair of ferromagnetic layers have a thin tunnel insulating layer interposed therebetween. The TMR effect was already discovered in the 1970s, but a TMR element based on the TMR effect started to attract public attention after it was proved in 1995 by Moodera et al. that the TMR element can achieve a large MR of 18%. In particular, since the TMR element has little exchange coupling between ferromagnetic layers, it can achieve a large MR even under the condition of a weak magnetic field. For example, it was proved that a magnetic tunnel junction (MTJ) device using an aluminum oxide layer or a magnesium oxide layer as a tunnel insulating layer can achieve a large MR of about 70% to about 200%.

FIG. 1 is a graph illustrating the characteristics of a GMR element and a TMR element.

Referring to FIG. 1, the TMR element is much larger in MR than the GMR element. Also, the TMR element is much smaller than the GMR element in terms of a switching current for data storage. In this respect, the TMR element can provide the characteristics of a large MR and a small switching current required for magnetic memories.

However, a further-reduced switching current is required in order to further increase the integration level of magnetic memories. In the case of the TMR element, the switching current can be reduced by increasing the thickness of the tunnel insulating layer, but an increase in the tunnel insulating layer's thickness leads to a decrease in the MR. On the other hand, a decrease in the tunnel insulating layer's thickness may lead to not only an increase in the write current but also a decrease in the reliability and endurance of the product.

SUMMARY

The present general inventive concept provides a magnetic memory device having characteristics of a large MR and a small switching current.

The present general inventive concept also provides a method of fabricating a magnetic memory device having the characteristics of a large MR and a small switching current.

Additional aspects and utilities of the present general inventive concept will be set forth in part in the description which follows and, in part, will be obvious from the description, or may be learned by practice of the general inventive concept.

Embodiments of the present general inventive concept provide magnetic memory devices including: a free layer; a write element changing the magnetization direction of the free layer; and a read element sensing the magnetization direction of the free layer. Herein, the write element includes a current confinement layer having a width smaller than the minimum width of the free layer to locally increase the density of a current flowing through the write element.

In some embodiments, the read element includes a lower pinning layer, a lower pinned layer, and a tunnel insulating layer; and the write element includes a nonmagnetic metal layer, the current confinement layer, an upper pinned layer, and an upper pinning layer. Herein, the tunnel insulating layer of the read element contacts one side of the free layer such that the read element and the free layer constitute a tunneling magneto-resistance (TMR) element; and the nonmagnetic metal layer of the write element contacts the other side of the free layer such that the write element and the free layer constitute a giant magneto-resistance (GMR) element.

In other embodiments, the current confinement layer is narrower than the nonmagnetic metal layer and the upper pinned layer and connects the nonmagnetic metal layer and the upper pinned layer in series. The current confinement layer may include at least one of conductive materials that have a thickness smaller than a spin-diffusion length thereof. For example, the current confinement layer is formed of at least one of copper (Cu), tantalum (Ta), titanium (Ti), niobium (Nb), zirconium (Zr), ruthenium (Ru), bismuth (Bi), titanium nitride (TiN), and tantalum nitride (TaN). Also, the nonmagnetic metal layer of the write element may be formed of copper.

In further embodiments, the sidewall of the current confinement layer is horizontally recessed to define a recess region between the nonmagnetic metal layer and the upper pinned layer. Herein, the magnetic memory device may further include an interlayer dielectric covering the write element and the read element, and the interlayer dielectric may define voids in the recess region.

In still further embodiments, the read element includes a lower pinning layer, a lower pinned layer, and a tunnel insulating layer; and the write element includes the current confinement layer, an upper pinned layer, and an upper pinning layer. Herein, the tunnel insulating layer of the read element contacts one side of the free layer such that the read element and the free layer constitute a tunneling magneto-resistance (TMR) element; and the current confinement layer of the write element contacts the other side of the free layer such that the write element and the free layer constitute a giant magneto-resistance (GMR) element.

Also, the current confinement layer may be at least one of nonmagnetic metal layers. In still further embodiments, the current confinement layer has the shape of a cup that has a bottom portion and a sidewall portion extending vertically from the edge of the bottom portion. In this case, the sidewall portion or the bottom portion of the current confinement layer directly contacts the other side of the free layer, and at least one of insulating layers may be formed in the sidewall portion of the current confinement layer. In still further embodiments, the current confinement layer has the shape of a cylinder.

In other embodiments of the present general inventive concept, methods of fabricating a magnetic memory device may include: forming a free layer; forming a read element sensing the magnetization direction of the free layer; and forming a write element changing the magnetization direction of the free layer, wherein the write element includes a current confinement layer having a width smaller than the minimum width of the free layer to locally increase the density of a current flowing through the write element.

In some embodiments, the methods may further include: sequentially forming a lower pinning layer, a lower pinned layer, a tunnel insulating layer, the free layer, a nonmagnetic layer, the current confinement layer, an upper pinned layer, an upper pinning layer, and a capping layer on a substrate; and patterning the capping layer, the upper pinning layer, the upper pinned layer, and the current confinement layer using the nonmagnetic layer as an etch stop layer. Herein, the patterning of the current confinement layer includes selectively etching the sidewall of the current confinement layer to cause the current confinement layer to have a width smaller than the minimum width of the free layer in order to locally increase the density of a current flowing from the upper pinned layer to the nonmagnetic layer.

In other embodiments, the forming of the current confinement layer includes forming at least one of conductive materials, which have an etch selectivity with respect to the nonmagnetic layer, the upper pinned layer, the upper pinning layer, and the capping layer, to a thickness smaller than a spin-diffusion length thereof.

In further embodiments, the lower pinning layer is formed of at least one of anti-ferromagnetic materials; the lower pinned layer includes at least one of ferromagnetic materials; the nonmagnetic layer is formed of copper; the upper pinned layer includes at least one of ferromagnetic materials; the upper pinning layer is formed of at least one of anti-ferromagnetic materials; and the current confinement layer is formed of at least one of copper (Cu), tantalum (Ta), titanium (Ti), niobium (Nb), zirconium (Zr), ruthenium (Ru), bismuth (Bi), titanium nitride (TiN), and tantalum nitride (TaN). Herein, the lower pinning layer, the lower pinned layer, the tunnel insulating layer, and the free layer constitute a tunneling magneto-resistance (TMR) element; and the free layer, the nonmagnetic layer, the current confinement layer, the upper pinned layer, and the upper pinning layer constitute a giant magneto-resistance (GMR) element.

In still further embodiments, the methods may further include, after the patterning of the current confinement layer, patterning the nonmagnetic layer and the free layer using the capping layer as an etch mask. Herein, the patterned nonmagnetic layer and free layer are formed to be wider than the patterned current confinement layer.

In still further embodiments, the write element may include the current confinement layer, an upper pinned layer, an upper pinning layer, and a capping layer. Herein, the current confinement layer, the upper pinned layer, the upper pinning layer, and the capping layer is formed on or under the free layer, and the current confinement layer contacts the free layer.

In still further embodiments, the forming of the current confinement layer may include: forming an insulating layer on the free layer or the upper pinning layer; forming a hole penetrating the insulating layer to expose the free layer or the upper pinning layer; forming a current confinement layer covering the inner wall of the hole; and removing the current confinement layer on the insulating layer. Herein, the current confinement layer may be formed of a nonmagnetic layer. In addition, the nonmagnetic layer may be formed to conformally cover the inner wall of the hole or to fill the hole.

BRIEF DESCRIPTION OF THE DRAWINGS

The accompanying figures are included to provide a further understanding of the present general inventive concept, and are incorporated in and constitute a part of this specification. The drawings illustrate exemplary embodiments of the present general inventive concept, and together with the description, serve to explain principles of the present general inventive concept. In the figures.

DETAILED DESCRIPTION OF THE EMBODIMENTS

Preferred embodiments of the present general inventive concept will be described below in more detail with reference to the accompanying drawings. The present general inventive concept may, however, be embodied in different forms and should not be constructed as limited to the embodiments set forth herein. Rather, these embodiments are provided so that this disclosure will be thorough and complete, and will fully convey the scope of the present general inventive concept to those skilled in the art.

In the specification, the dimensions of layers and regions are exaggerated for clarity of illustration. It will also be understood that when a layer (or film) is referred to as being 'on' another layer or substrate, it can be directly on the other layer or substrate, or intervening layers may also be present. Also, though terms like a first, a second, and a third are used to describe various regions and layers in various embodiments of the present general inventive concept, the regions and the layers are not limited to these terms. These terms are used only to tell one region or layer from another region or layer. Therefore, a layer referred to as a first layer in one embodiment can be referred to as a second layer in another embodiment. An embodiment described and exemplified herein includes a complementary embodiment thereof.

FIGS. 2 through 6 are sectional views illustrating a method of fabricating a magnetic memory device according to an embodiment of the present general inventive concept.

A method of fabricating a magnetic memory device according to an embodiment of the present general inventive concept includes: forming a free layer on a substrate; forming a read element to sense the magnetization direction of the free layer; and forming a write element to change the magnetization direction of the free layer.

Figure 1:
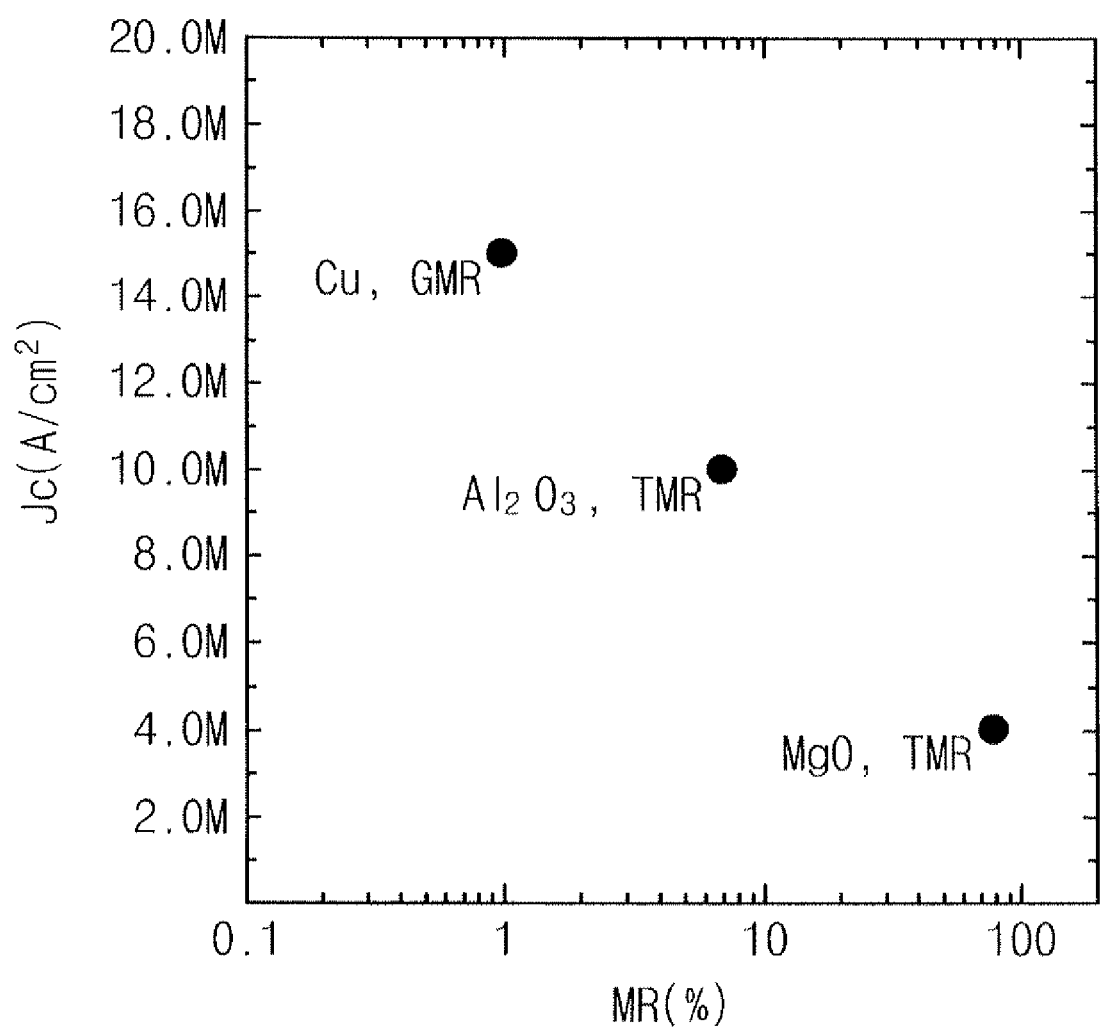
FIG. 1 is a graph illustrating the characteristics of a GMR element and a TMR element.
Figure 2:
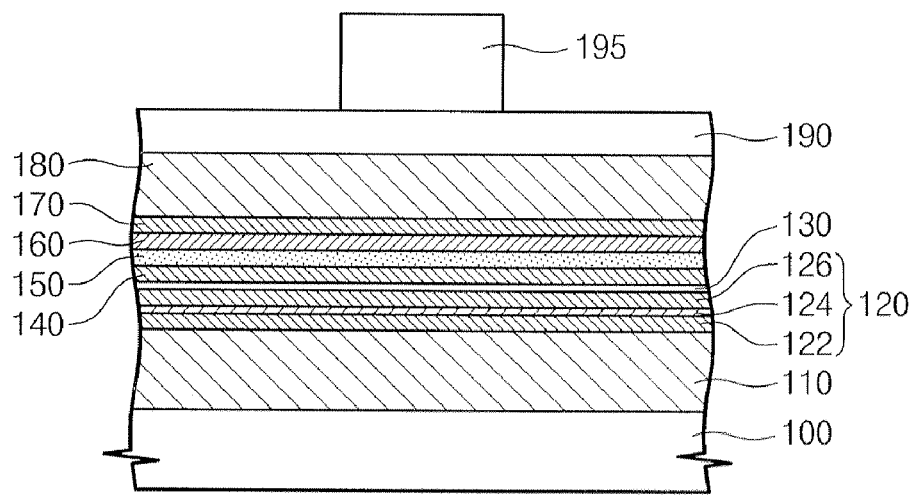
FIGS. 2 through 6 are sectional views illustrating a method of fabricating a magnetic memory device according to an embodiment of the present general inventive concept.

Referring to FIG. 2, a bottom electrode 100, a first multilayer thin film structure, a free layer 140, and a second multilayer thin film structure are sequentially formed on a substrate. The first multilayer thin layer structure may include a lower pinning layer 110, a lower pinned layer 120, and a tunnel insulating layer 130, and the second multilayer thin film structure may include a nonmagnetic layer 150, a current confinement layer 160, an upper pinned layer 170, and an upper pinning layer 180. In addition, a capping layer 190 and a mask pattern 195 may be formed on the upper pinning layer 180.

According to this embodiment, the free layer 140 is formed directly on the tunnel insulating layer 130 and the nonmagnetic layer 150 is formed directly on the free layer 140. The first multilayer thin film structure and the free layer 140 constitute a read element to sense the magnetization direction of the free layer 140, and the second multilayer thin film structure and the free layer 140 constitute a write element to change the magnetization direction of the free layer 140.

The lower pinning layer 110 is formed of an anti-ferromagnetic layer and may be formed of at least one of PtMn, IrMn, MnO, MnS, MnTe, $MnF_2$, $FeF_2$, $FeCl_2$, FeO, $CoCl_2$, CoO, $NiCl_2$, NiO, and Cr. Also, the lower pinned layer 120 is formed of a ferromagnetic layer and may be formed of at least one of CoFeB, CoFe, Fe, Co, Ni, Gd, Dy, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. According to the present embodiment, the lower pinned layer 120 may be a three-layer structure that has a ruthenium (Ru) layer interposed between the above-described ferromagnetic materials, as illustrated in FIG. 2. For example, the lower pinned layer 120 may include a lower ferromagnetic layer 122, a ruthenium layer 124, and an upper ferromagnetic layer 126. More specifically, the lower ferromagnetic layer 122 may be a CoFe layer with a thickness of about 20 Å to about 110 Å; the upper ferromagnetic layer 126 may be a CoFeB layer with a thickness of about 20 Å to about 120 Å; and the ruthenium layer 124 may have a thickness of about 5 Å to about 10 Å.

The tunnel insulating layer 130 is formed of an insulating material, and may be one of a magnesium oxide layer and an aluminum oxide layer. According to an embodiment, the tunnel insulating layer 130 may be a magnesium oxide layer formed to a thickness of about 7 Å to about 10 Å. The free layer 140 is formed of a ferromagnetic layer, may be formed of at least one of CoFeB, CoFe, Fe, Co, Ni, Gd, Dy, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$, and may have a thickness of about 20 Å to about 40 Å.

The nonmagnetic layer 150 is formed of a nonmagnetic conductive material (e.g., copper) and may have a thickness of about 10 Å to about 500 Å. The upper pinned layer 170 may include at least one of ferromagnetic materials, and the upper pinning layer 180 may be formed of at least one of anti-ferromagnetic materials. For example, the upper pinned layer 170 may include at least one of CoFeB, CoFe, Fe, Co, Ni, Gd, Dy, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$, and the upper pinning layer 180 may be formed of at least one of PtMn, IrMn, MnO, MnS, MnTe, $MnF_2$, $FeF_2$, $FeCl_2$, FeO, $CoCl_2$, CoO, $NiCl_2$, NiO, and Cr. In addition, although not illustrated in FIG. 2, according to a modified embodiment of the present general inventive concept, the upper pinned layer 170 may be a three-layer structure with a ruthenium layer like the lower pinned layer 120.

The current confinement layer 160 is formed of one of materials that can be selectively etched while minimizing the etching of the nonmagnetic layer 150, the upper pinned layer 170, and the upper pinning layer 180 in an etch process using a predetermined etch technique. In addition, the current confinement layer 160 is formed of at least one of materials capable of providing a long spin-diffusion length, and may have a thickness smaller than the spin-diffusion length. Herein, the spin-diffusion length refers to an effective length to which an electron can travel in a predetermined thin layer without a change in the spin thereof. For example, the current confinement layer 160 may be formed of at least one of copper (Cu), tantalum (Ta), titanium (Ti), niobium (Nb), zirconium (Zr), ruthenium (Ru), bismuth (Bi), titanium nitride (TiN), and tantalum nitride (TaN). However, it will be apparent that the technical concept of the present general inventive concept is not limited to the exemplified materials. That is, any conductive materials capable of satisfying technical requirements related to the above-described etch selectivity and spin-diffusion length may be used to form the current confinement layer 160.

Figure 3:
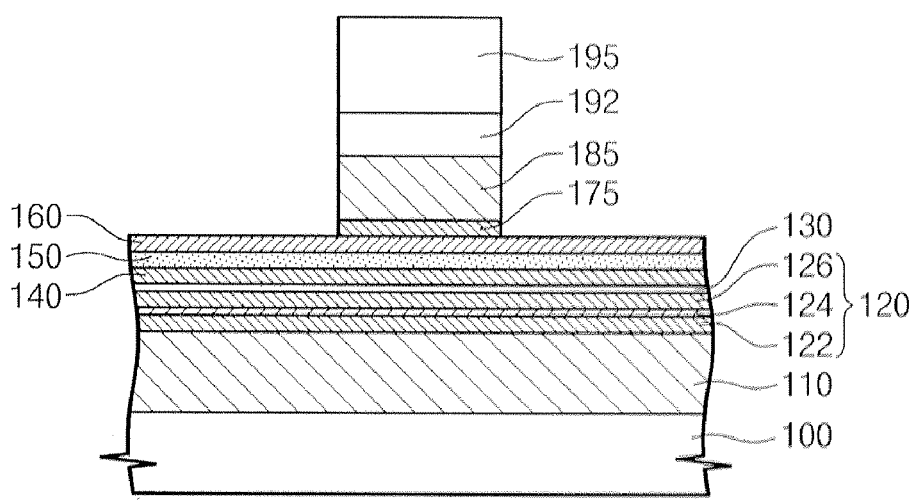
Figure 4:
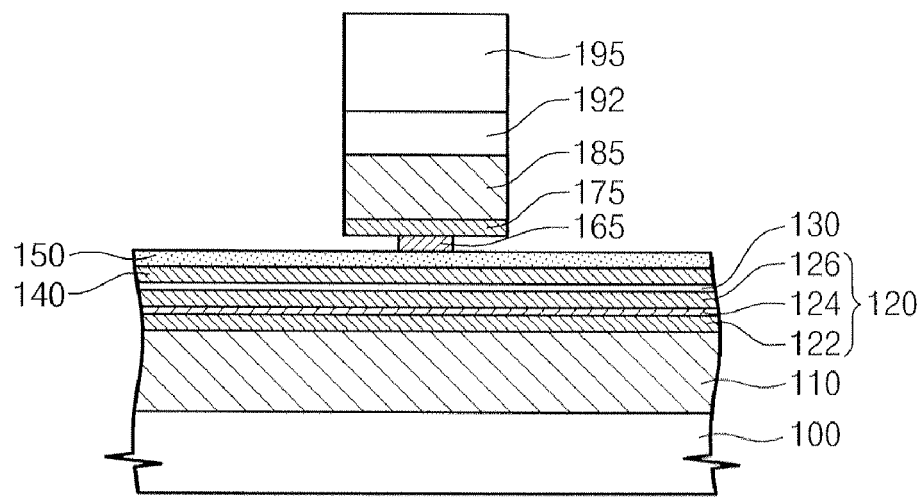

Referring to FIGS. 3 and 4, using the mask pattern 195 as an etch mask, the capping layer 190, the upper pining layer 180, and the upper pinned layer 170 are patterned to form a capping pattern 192, an upper pinning pattern 185, and an upper pinned pattern 175 that expose the current confinement layer 160. This patterning process may be formed using an etch recipe that has an etch selectivity with respect to the current confinement layer 160.

Thereafter, the exposed current confinement layer 160 is etched to form a current confinement pattern 165 under the upper pinned pattern 175, which exposes the nonmagnetic layer 150 while defining an undercut region. This process includes isotropically etching the current confinement layer 160 using an etch recipe that has an etch selectivity with respect to the capping pattern 192, the upper pinning pattern 185, the upper pinned pattern 175, and the nonmagnetic layer 150. Accordingly, the current confinement pattern 165 is formed to be smaller in width and area than the upper pinned pattern 175. The isotropical etching of the current confinement layer 160 may be performed using a dry etching process or a wet etching process.

According to a modified embodiment of the present general inventive concept, the capping layer 190, the upper pinning layer 180, the upper pinned layer 170, and the current confinement layer 160 may be anisotropically etched until the top of the nonmagnetic layer 150 is exposed. In this case, the patterned current confinement layer can be formed to be substantially identical in width and area to the upper pinned pattern 175. Thereafter, the sidewall of the exposed current confinement layer is horizontally recessed by an isotropical etching process to form a current confinement pattern 165 that defines an undercut region, like the previous embodiment.

Figure 5:
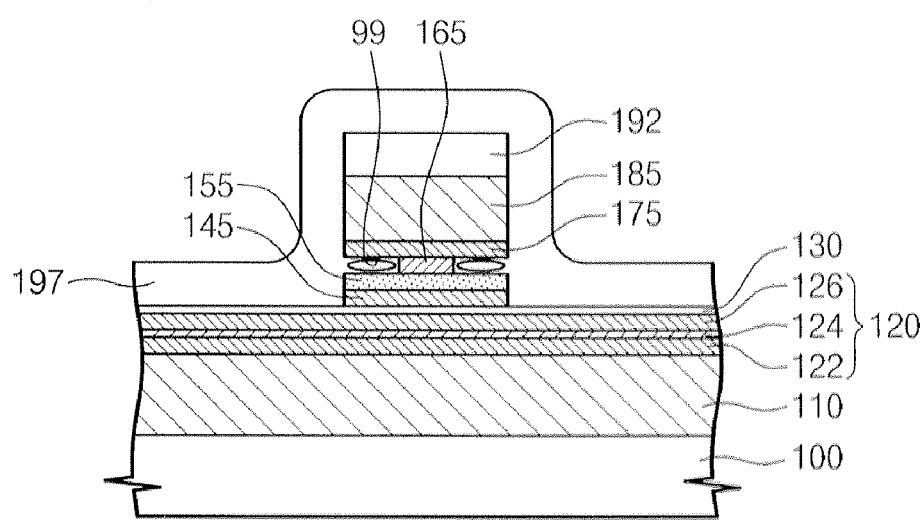
Figure 6:
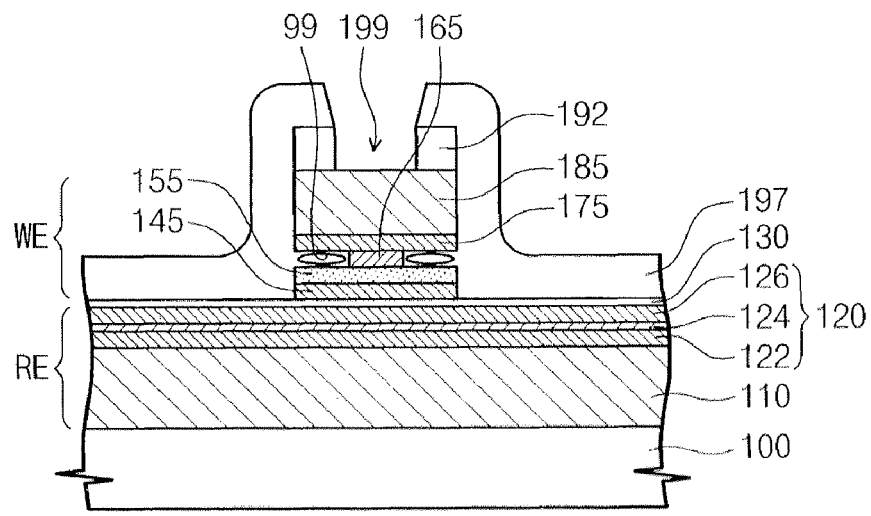

Referring to FIGS. 5 and 6, using the mask pattern 195 as an etch mask, the nonmagnetic layer 150 and the free layer 140 are anisotropically etched to form a nonmagnetic pattern 155 and a free layer pattern 145, which are substantially identical in width and area to the upper pinned pattern 175, and positioned between the current confinement pattern 165 and the tunnel insulating layer 130. This process may be performed using an etch technique having an etch selectivity with respect to the tunnel insulating layer 130, but the tunnel insulating layer 130 may also be patterned in this process to expose the lower pinned layer 120.

Figure 7:
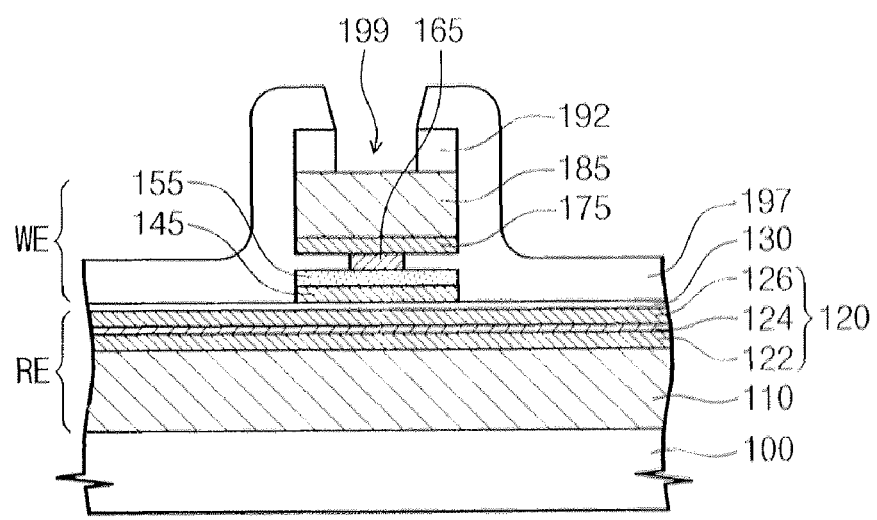
FIG. 7 is a sectional view of a magnetic memory device according to an embodiment of the present general inventive concept.

Thereafter, the mask pattern 195 is removed and an insulating layer 197 is formed on the resulting structure. As illustrated in FIG. 5, the insulating layer 197 may be configured to form voids 99 in an undercut region around the current confinement pattern 165. According to another embodiment, the insulating layer 197 may fully fill the undercut region such that the voids are not formed, as illustrated in FIG. 7. The insulating layer 197 and the capping pattern 192 are patterned to form an opening portion 199 exposing the upper pinning pattern 185.

According to a modified embodiment of the present general inventive concept, the mask pattern 195 may be removed before the patterning of the nonmagnetic layer 150. In this case, the capping pattern 192 may be used as an etch mask to pattern the nonmagnetic layer 150 and the free layer 140. According to another modified embodiment of the present general inventive concept, the capping pattern 192 may be formed of a conductive layer or a metal layer. In this case, the opening portion 199 may be formed to expose the top of the capping pattern 192.

FIG. 7 is a sectional view of a magnetic memory device according to an embodiment of the present general inventive concept. In describing this embodiment, the technical features already described with reference to FIGS. 2 through 6 will be omitted for conciseness.

Referring to FIG. 7, according to this embodiment, the upper pinning pattern 185, the upper pinned pattern 175, the current confinement pattern 165, and the nonmagnetic pattern 155 are used as a write element WE to change the magnetization direction of the free layer pattern 145; and the lower pinning layer 110, the lower pinned layer 120, and the tunnel insulating layer 130 are used as a read element RE to sense the magnetization direction of the free layer pattern 145. The write element WE controls the magnetization direction of the free layer pattern 145 by using the known spin-torque transfer mechanism, and the read element RE senses the magnetization direction of the free layer pattern 145 by using a resistance (i.e., a magneto-resistance) depending on the magnetization direction between the free layer pattern 145 and the lower pinned layer 120.

Herein, the current confinement pattern 165 is disposed between the upper pinned pattern 175 and the nonmagnetic pattern 155 and is smaller in width and area than the upper pinned pattern 175 and the nonmagnetic pattern 155. Accordingly, even when the amount of a current flowing from the upper pinned pattern 175 into the current confinement pattern 165 does not increase, the density of a current flowing from the current confinement pattern 165 to the nonmagnetic pattern 155 increases locally in the current confinement pattern 165. The current density in the current confinement pattern 165 is higher than a critical switching current density required to change the magnetization direction of the free layer pattern 145, and the width of the current confinement pattern 165 is selected to satisfy such a condition.

Figure 8:
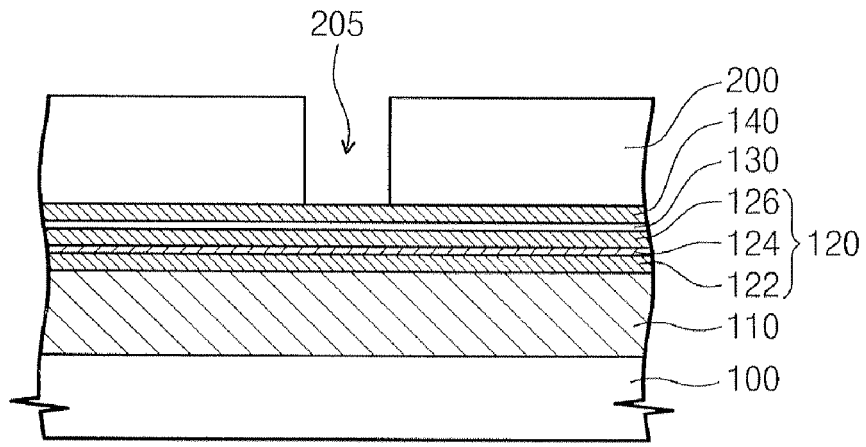
FIGS. 8 through 10 are sectional views illustrating a method of fabricating a magnetic memory device according to another embodiment of the present general inventive concept.
Figure 9:
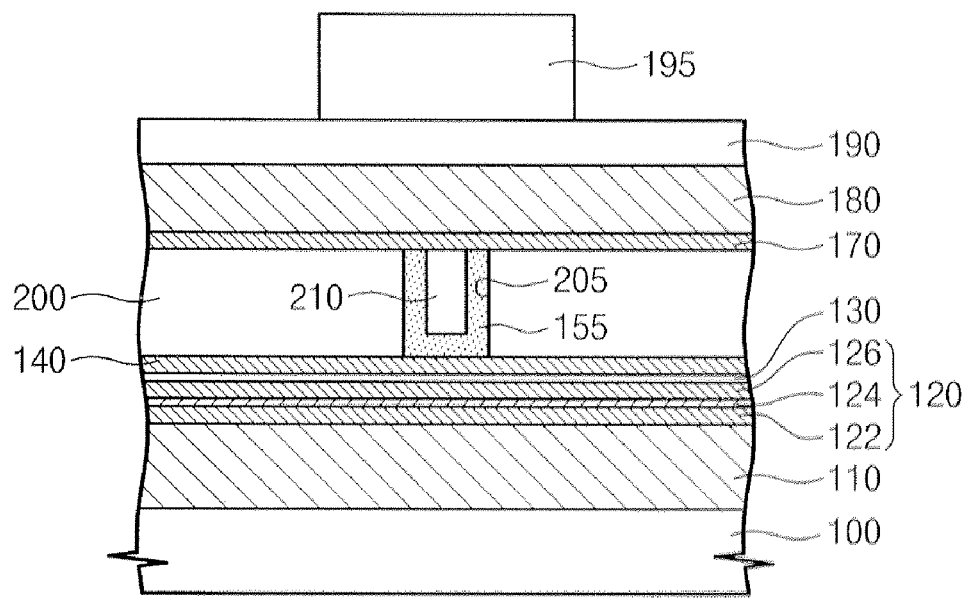
Figure 10:
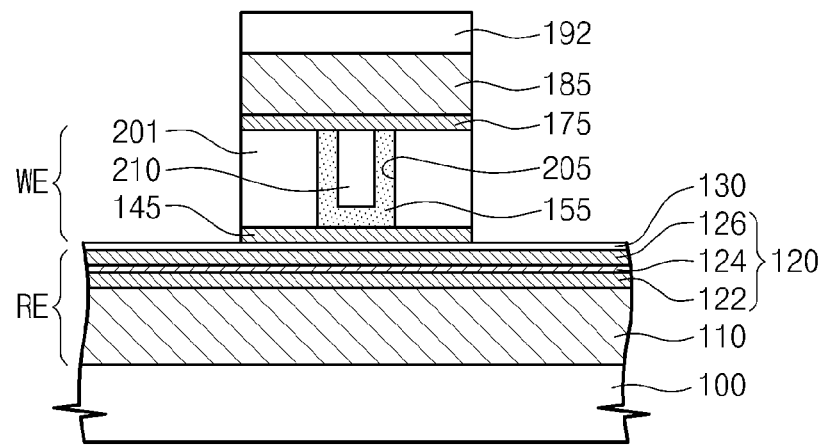

FIGS. 8 through 10 are sectional views illustrating a method of fabricating a magnetic memory device according to another embodiment of the present general inventive concept.

Referring to FIG. 8, a bottom electrode 100, a first multilayer thin film structure, and a free layer 140 are sequentially formed on a substrate. Thereafter, a first insulating layer 200 is formed on the free layer 140 to define a hole 205 exposing the top of the free layer 140.

The first multilayer thin film structure may include a lower pinning layer 110, a lower pinned layer 120, and a tunnel insulating layer 130, and the types of materials for the respective layers of the first multilayer thin film structure and the free layer 140 may be identical to those of the embodiment described with reference to FIG. 2.

Figure 11:
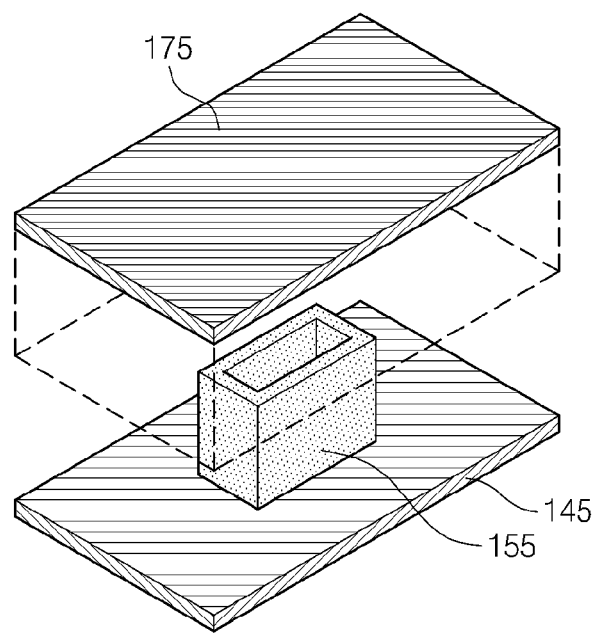
FIG. 11 is a perspective view of a magnetic memory device according to another embodiment of the present general inventive concept.

Referring to FIG. 9, a nonmagnetic layer 150 is conformally formed on the first insulating layer 200 with the hole 205, and a second insulating layer 210 is formed to fill the rest of the hole 205 not filled with the nonmagnetic layer 150. Thereafter, the second insulating layer 210 and the nonmagnetic layer 150 are etched until the top of the first insulating layer 200 is exposed. Accordingly, a cup-shaped nonmagnetic pattern 155 is formed between the first insulating layer 200 and the second insulating layer 210 as illustrated in FIG. 11.

An upper pinned layer 170, an upper pinning layer 180, a capping layer 190, and a mask pattern 195 are sequentially formed on the resulting structure including the nonmagnetic pattern 155. The mask pattern 195 is formed to be wider than the hole 205. Also, the upper pinned layer 170, the upper pinning layer 180, the capping layer 190, and the mask pattern 195 may be identical to those of the embodiment described with reference to FIG. 2.

Referring to FIG. 10, the capping layer 190, the upper pinning layer 180, the upper pinned layer 170, the first insulating layer 200, and the free layer 140 are patterned using the mask pattern 195 as an etch mask. Accordingly, a free layer pattern 145, an upper pinned pattern 175, an upper pinning pattern 185, and a capping pattern 192 are formed on the tunnel insulating layer 130; and a first insulating layer pattern 201 is formed between the free layer pattern 145 and the upper pinned pattern 175 to surround the nonmagnetic pattern 155.

According to this embodiment, a contact area between the nonmagnetic pattern 155 and the upper pinned pattern 175 is determined by the cup-shaped nonmagnetic pattern 155 that is formed to be smaller than the upper pinned pattern 175. Accordingly, even when the amount of a current flowing from the upper pinned pattern 175 into the nonmagnetic pattern 155 does not increase, the density of a current flowing from the nonmagnetic pattern 155 to the free layer pattern 145 increases locally in the nonmagnetic pattern 155. In this context, the nonmagnetic pattern 155 of this embodiment is used as a current confinement pattern for a write element. The current density in the nonmagnetic pattern 155 is higher than a critical switching current density required to change the magnetization direction of the free layer pattern 145, and the width of the hole 205 is selected to satisfy such a condition.

Figure 12:
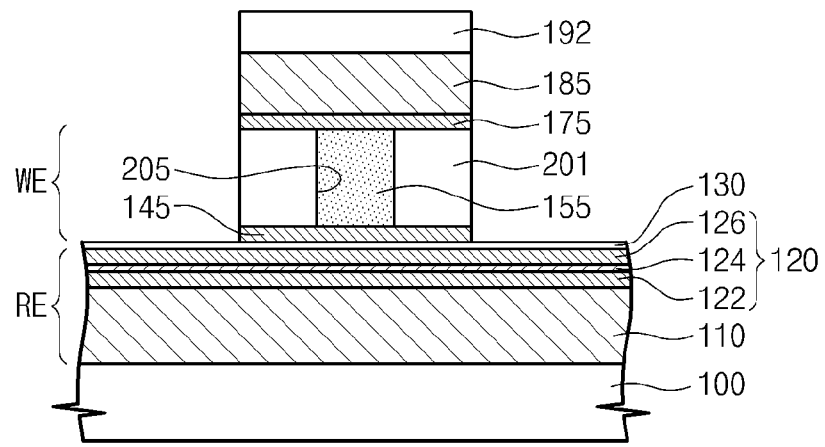
FIG. 12 is a sectional view of a magnetic memory device according to a modified embodiment of the present general inventive concept.
Figure 13:
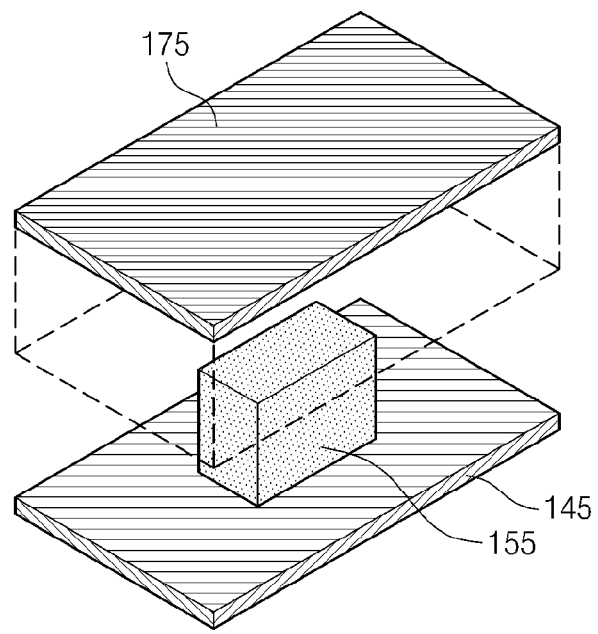
FIG. 13 is a perspective view of a magnetic memory device according to a modified embodiment of the present general inventive concept.

FIGS. 12 and 13 are respectively a sectional view and a perspective view of a magnetic memory device according to a modified embodiment of the present general inventive concept.

Referring to FIGS. 12 and 13, the horizontal sectional areas of a nonmagnetic pattern 155 according to this embodiment may be substantially identical in shape. For example, the nonmagnetic pattern 155 may have the shape of a cylinder or a regular hexahedron. Unlike this exemplary embodiment, the nonmagnetic pattern according to the embodiment of FIG. 11 has the shape of a cup in that a bottom portion is covered such that the bottom portion is contacting the free layer pattern 145 and a sidewall portion sidewall portions extend vertically from the edge of the bottom portion, and thus its horizontal sectional area is smaller at the height spaced apart from the bottom portion than at the bottom portion. Accordingly, the nonmagnetic pattern according to the embodiment of FIG. 11 has a higher current density than the nonmagnetic pattern 155 according to the embodiment of FIG. 12. However, when the integration level of a magnetic memory increases, a desired current density can be achieved also by the nonmagnetic pattern 155 according to the embodiment of FIG. 12. Therefore, the nonmagnetic pattern 155 according to the embodiment of FIG. 12 can be used in a magnetic memory with an increased integration level.

Figure 14:
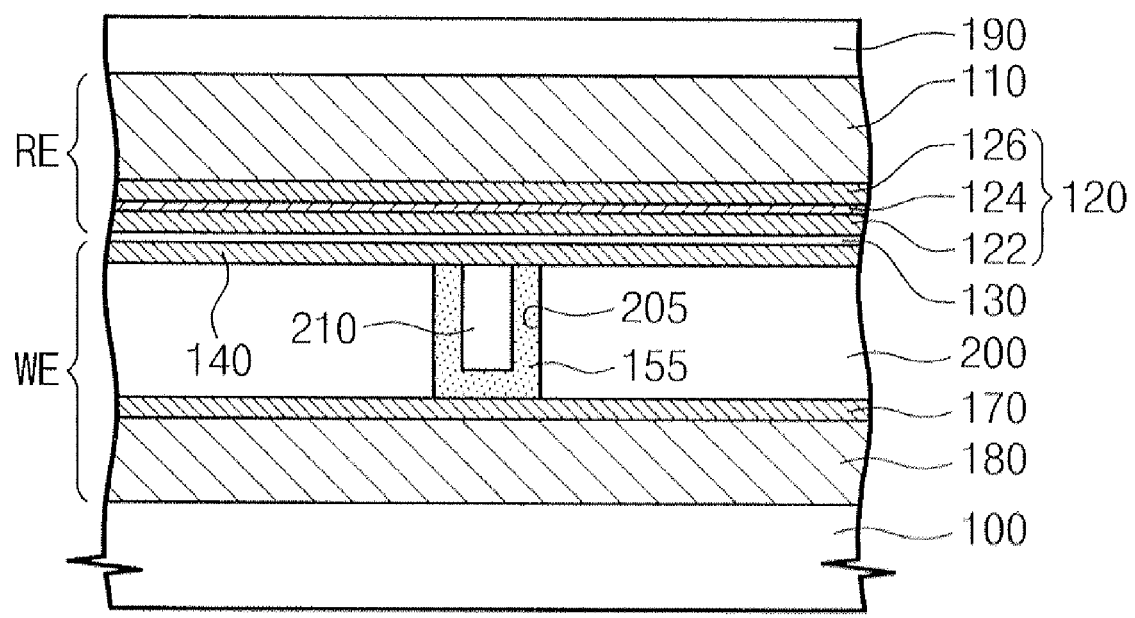
FIG. 14 is a sectional view of a magnetic memory device according to another modified embodiment of the present general inventive concept.

According to another modified embodiment of the present general inventive concept, as illustrated in FIG. 14, a write element WE is formed adjacent to a bottom electrode 100, and a free layer 140 and a first multilayer thin film structure for a read element RE are formed on the write element WE. In this case, a nonmagnetic pattern 155 constituting the write element WE may be formed through the process according to the embodiment described with reference to FIG. 9.

According to the present general inventive as described above, a GMR element connected in series to a TMR element has a current confinement pattern with a reduced sectional area. Thus, a switching current density to change the magnetization direction of the free layer can be locally increased without changing the amount of a current supplied to the GMR element. Therefore, it is possible to fabricate a magnetic memory device having the characteristics of a large MR and a small switching current.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A magnetic memory device comprising:
a free layer;
a write element to change the magnetization direction of the free layer; and
a read element to sense the magnetization direction of the free layer,
wherein the write element comprises a current confinement layer having a width smaller than the minimum width of the free layer to locally increase the density of a current flowing through the write element,
wherein the read element comprises a lower pinning layer, a lower pinned layer, and a tunnel insulating layer, and the write element comprises a nonmagnetic metal layer, the current confinement layer, an upper pinned layer, and an upper pinning layer,
wherein the tunnel insulating layer of the read element contacts one side of the free layer such that the read element and the free layer constitute a tunneling magneto-resistance (TMR) element, and the nonmagnetic metal layer of the write element contacts the other side of the free layer such that the write element and the free layer constitute a giant magneto-resistance (GMR) element,
wherein the sidewall of the current confinement layer is horizontally recessed to define a recess region between the nonmagnetic metal layer and the upper pinned layer, and the magnetic memory device further comprises an interlayer dielectric covering the write element and the read element, and
wherein the interlayer dielectric defines voids in the recess region.

2. The magnetic memory device of claim 1, wherein the current confinement layer is narrower than the nonmagnetic metal layer and the upper pinned layer and connects the nonmagnetic metal layer and the upper pinned layer in series.

3. The magnetic memory device of claim 1, wherein the current confinement layer comprises at least one of conductive materials that have a thickness smaller than a spin-diffusion length thereof.

4. The magnetic memory device of claim 1, wherein the current confinement layer is formed of at least one of copper (Cu), tantalum (Ta), titanium (Ti), niobium (Nb), zirconium (Zr), ruthenium (Ru), bismuth (Bi), titanium nitride (TiN), and tantalum nitride (TaN).

5. The magnetic memory device of claim 1, wherein the nonmagnetic metal layer of the write element is formed of copper.

6. The magnetic memory device of claim 1,
wherein
the current confinement layer of the write element contacts the other side of the free layer such that the write element and the free layer constitute a giant magneto-resistance (GMR) element.

7. The magnetic memory device of claim 6, wherein the current confinement layer is at least one of nonmagnetic metal layers.

8. The magnetic memory device of claim 6, wherein the current confinement layer has the shape of a cup that has a bottom portion and a sidewall portion extending vertically from the edge of the bottom portion.

9. The magnetic memory device of claim 8, wherein the sidewall portion or the bottom portion of the current confinement layer directly contacts the other side of the free layer.

10. The magnetic memory device of claim 8, wherein at least one of insulating layers is formed in the sidewall portion of the current confinement layer.

11. The magnetic memory device of claim 6, wherein the current confinement layer has the shape of a cylinder.

12. A magnetic memory device comprising:
a write element including a current confinement portion and a free layer, wherein a magnetization direction of the free layer is changeable in response to the current density through the current confinement portion; and
a read element to sense the magnetization direction of the free layer,
wherein the read element comprises a lower pinning layer, a lower pinned layer, and a tunnel insulating layer, and the write element cormprises a nonmagnetic metal layer, the current confinement layer, an upper pinned layer, and an upper pinning layer,
wherein the tunnel insulating layer of the read element contacts one side of the free layer such that the read element and the free layer constitute a tunneling magneto-resistance (TMR) element, and the nonmagnetic metal layer of the write element contacts the other side of the free layer such that the write element and the free layer constitute a giant magneto-resistance (GMR) element,
wherein the sidewall of the current confinement layer is horizontally recessed to define a recess region between the nonmagnetic metal layer and the upper pinned layer, and the magnetic memory device further comprises an interlayer dielectric covering the write element and the read, element, and wherein the interlayer dielectric defines voids in the recess region.

13. The magnetic memory device of claim 12, wherein the current confinement portion includes a width smaller than the minimum width of the free layer to locally increase the density of a current flowing through the write element.

14. The magnetic memory device of claim 12, wherein the upper pinning layer, the upper pinned layer, the current confinement layer and the nonmagnetic metal layer change the magnetic direction of the free layer.

* * * * *